(12) United States Patent
Taylor (10) Patent No.: US 8,637,762 B2
(45) Date of Patent: Jan. 28, 2014

(54) HIGH TRANSMISSION GLASS GROUND AT EDGE PORTION(S) THEREOF FOR USE IN ELECTRONIC DEVICE SUCH AS PHOTOVOLTAIC APPLICATIONS AND CORRESPONDING METHOD

(75) Inventor: Thomas J. Taylor, Northville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1491 days.

(21) Appl. No.: 11/600,912

(22) Filed: Nov. 17, 2006

(65) Prior Publication Data

US 2008/0115828 A1 May 22, 2008

(51) Int. Cl.
*H01L 31/00* (2006.01)

(52) U.S. Cl.
USPC ............................ 136/256; 136/252; 136/259

(58) Field of Classification Search
USPC ........................................ 136/252, 256, 259
See application file for complete search history.

(56) References Cited

U.S. PATENT DOCUMENTS

| | | | |
|---|---|---|---|
| 4,510,344 A | | 4/1985 | Berman |
| 4,806,436 A | | 2/1989 | Tada et al. |
| 4,830,038 A | * | 5/1989 | Anderson et al. ............. 136/251 |
| 5,214,008 A | | 5/1993 | Beckwith et al. |
| 5,964,962 A | | 10/1999 | Sannomiya et al. |
| 5,977,477 A | | 11/1999 | Shiozaki |
| 6,300,556 B1 | | 10/2001 | Yamagishi et al. |
| 6,365,823 B1 | * | 4/2002 | Kondo ........................... 136/246 |
| 6,372,327 B1 | | 4/2002 | Burnham et al. |
| 6,403,509 B2 | | 6/2002 | Cochran et al. |
| 6,407,021 B1 | | 6/2002 | Kitayama et al. |
| 6,461,736 B1 | | 10/2002 | Nagashima et al. |
| 6,498,118 B1 | | 12/2002 | Landa et al. |
| 6,506,622 B1 | | 1/2003 | Shiozaki |
| 6,521,558 B2 | | 2/2003 | Landa et al. |
| 6,573,207 B2 | | 6/2003 | Landa et al. |
| 6,610,622 B1 | | 8/2003 | Landa et al. |
| 6,716,780 B2 | | 4/2004 | Landa et al. |
| 6,796,146 B2 | | 9/2004 | Burnham |

(Continued)

FOREIGN PATENT DOCUMENTS

| | | |
|---|---|---|
| JP | 07-122764 | 5/1995 |
| JP | 11-60269 | 3/1999 |

OTHER PUBLICATIONS

"Colored Glasses" Weyl; The Society of Glass Technology 1951, (4pgs).

(Continued)

*Primary Examiner* — Jonathan Johnson
*Assistant Examiner* — Lindsey Bernier
(74) *Attorney, Agent, or Firm* — Nixon & Vanderhye P.C.

(57) ABSTRACT

Certain example embodiments of this invention relate to a glass substrate that is patterned and may be at least partially ground down at edge portion(s) thereof, for use as a light incident glass substrate in electronic devices such as photovoltaic devices or the like. In certain example embodiments, the glass may be a low-iron type glass which may be highly oxidized thereby permitting the glass to realize a combination of high visible transmission (Lta or $T_{vis}$), high infrared (IR) transmission, and/or high total solar (TS) transmission. In certain example embodiments, edge portion(s) of the patterned side of the glass may be ground down so that a seal may be more securely and/or efficiently attached to device so as to at least partially encapsulate at least part of the electronic device including the front glass substrate thereof.

18 Claims, 3 Drawing Sheets

(56) References Cited

U.S. PATENT DOCUMENTS

| | | |
|---|---|---|
| 6,949,484 B2 | 9/2005 | Landa et al. |
| 2002/0026955 A1* | 3/2002 | Ouchida et al. ............... 136/251 |
| 2004/0121896 A1 | 6/2004 | Landa et al. |
| 2004/0173256 A1* | 9/2004 | Kageyama et al. ........... 136/246 |
| 2004/0209757 A1 | 10/2004 | Landa et al. |
| 2005/0115603 A1* | 6/2005 | Yoshida et al. ............... 136/251 |
| 2005/0188725 A1 | 9/2005 | Tullman et al. |
| 2006/0169316 A1* | 8/2006 | Thomsen et al. ............. 136/251 |
| 2006/0249199 A1 | 11/2006 | Thomsen et al. |

OTHER PUBLICATIONS

"Colour Generation and Control in Glass", Bamford, Glass Science and Technology, 2, 1977 (3pgs).

"Photovoltaic Module Performance and Durability Following Long-Term Field Exposure", King et al., Sandia National Laboratories, (19pgs).

* cited by examiner

Photovoltaic Cell

Fig. 3

HIGH TRANSMISSION GLASS GROUND AT EDGE PORTION(S) THEREOF FOR USE IN ELECTRONIC DEVICE SUCH AS PHOTOVOLTAIC APPLICATIONS AND CORRESPONDING METHOD

This invention relates to a glass substrate that is patterned and may be at least partially ground down at edge portion(s) thereof, for use as a light incident glass substrate in an electronic device such as a photovoltaic device or the like. In certain example embodiments, the glass may be a low-iron type glass thereby permitting the glass to realize a combination of high visible transmission (Lta or $T_{vis}$) high infrared (IR) transmission, and/or high total solar (TS) transmission. In certain example embodiments, edge portion(s) of the patterned side of the glass may be ground down so that a seal may be more securely and/or efficiently attached to the electronic device so as to at least partially encapsulate at least part of the electronic device including the front glass substrate thereof.

BACKGROUND AND SUMMARY OF EXAMPLE EMBODIMENTS OF THE INVENTION

Photovoltaic devices such as solar cells are known in the art. A solar cell may include, for example, a photoelectric transfer film made up of one or more layers located between a pair of substrates or other layers. These layers may be supported by a glass substrate. Example solar cells are disclosed in U.S. Pat. Nos. 4,510,344, 4,806,436, 6,506,622, 5,977,477, and JP 07-122764, the disclosures of which are hereby incorporated herein by reference.

Substrates in solar cells (or photovoltaic devices) are sometimes made of glass. Glass that is fairly clear in color and highly transmissive to visible light is sometimes desirable. Glass raw materials (e.g., silica sand, soda ash, dolomite, and/or limestone) typically include certain impurities such as iron, which is a colorant. The total amount of iron present in glass is expressed herein in terms of $Fe_2O_3$ in accordance with standard practice. However, typically, not all iron is in the form of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

Higher transmission through light incident flat glass substrates of photovoltaic devices has been achieved by lowering the levels of impurities in the glass, especially iron, that contribute to the absorption of energy. In this regard, it has been found that the use of a low-iron highly transparent glass is advantageous for solar cell applications. However, it would be desirable if visible transmission could be further increased, thereby permitting photovoltaic devices to be even more efficient in the generation of electrical current from sunlight.

Thus, it will be appreciated that there exists a need in the art for a high transmission glass structure for use in electronic devices such as photovoltaic devices, where the glass structure is capable of allowing much solar radiation to pass there through. At the same time, it would also be desirable if the glass structure could be designed such that seals/casings could efficiently and securely be attached to the electronic device in order to adequately protect the same from mechanical damage and/or environmental conditions.

Transmission of solar radiation (UV, visible and/or IR) through a glass substrate can be increased by reducing the approximately 4% of light that is reflected off of the flat top surface of a light-incident side glass substrate of a photovoltaic device. One technique for further achieving such a reduction in reflectance (and thus achieving an increase in transmission by reducing reflection) is to use a patterned glass substrate on the light-incident side of the photovoltaic device. A patterned or heavily textured glass as a light-incident side glass substrate of a photovoltaic device may have geometric features such as cones, pyramids, and/or ridges formed in the light-incident surface of the glass substrate which are designed to recapture reflected light so as to increase the transmission of light through the glass substrate toward the semiconductor absorber. Such patterns are especially effective at capturing so called off-axis light, e.g., that which is present in the early morning and/or late afternoon situations, thereby increasing the efficiency of the device.

Thus, the use of a low-iron glass composition in combination with a patterned major surface of the light-incident glass substrate has been found to be advantageous with respect to optical properties, thereby leading to increased solar efficiency of photovoltaic devices such as solar cells. In photovoltaic devices, it is generally desirable for the glass substrate on the light-incident side of the semiconductor film (sometimes referred to as the semiconductor absorber) to allow as much radiation as possible (UV, IR and visible) to pass therethrough so that the photoelectric semiconductor transfer film (or semiconductor absorber) of the device can convert the radiation to as much current as possible. The less radiation allowed to pass through the glass substrate, the less current generated in the photovoltaic device.

In certain example embodiments of this invention, the major surface of the glass substrate on the light-incident side of the electronic device (e.g., photovoltaic device) is ground down so as to be substantially flat at edge portion(s) of the patterned side of the glass. In certain example embodiments, this grinding may be performed only at or proximate edge portions of the glass substrate (i.e., not in central portions of the light-incident glass substrate). The ground portions proximate the edge portion(s) of the glass are advantageous, for example, in that a frame (e.g., metal frame) can more easily fit around the edge(s) of the electronic device so as to at least partially encapsulate the device. Such frames are provided around the edges of photovoltaic devices, for instance, in order to protect the edges from mechanical damage and/or to seal the edges against ingress of water and the like. The ground-flat portions may be provided around the entire periphery of the glass substrate (e.g., at or proximate edge portions along all four sides of a rectangular substrate) in certain example instances, or alternatively around only one, two or three sides of the glass substrate in alternative instances, according to different embodiments of this invention.

In certain example embodiments of this invention, there is provided a photovoltaic device comprising: a glass substrate, a front electrode, and a photoelectric film, where the front electrode is provided between at least the glass substrate and the photoelectric film; the glass substrate having first and second major surfaces, with at least part of the first major surface of the glass substrate being patterned and located at a light-incident side of the glass substrate so that light incident on the photovoltaic device hits the first major surface of the glass substrate before hitting the second major surface of the glass substrate; wherein at least a central portion of the first major surface of the glass substrate is patterned so as to define a plurality of peaks and valleys in a patterned portion; a frame encapsulating at least part of an edge of the photovoltaic device so as to protect the at least part of the edge of the photovoltaic device from damage; and wherein an edge portion of the first major surface of the glass substrate, immediately adjacent an absolute edge of the glass substrate, is substantially flat and is located immediately adjacent the peaks and/or valleys of the patterned portion on the same first major surface, and wherein part of the frame is located over the substantially flat edge portion but not over the patterned portion of the first major surface of the glass substrate.

In other example embodiments of this invention, there is provided a glass substrate for use in an electronic device, the glass substrate comprising: the glass substrate having first and second major surfaces, with at least part of the first major surface of the glass substrate being patterned and located at a light-incident side of the glass substrate so that light incident on the photovoltaic device hits the first major surface of the glass substrate before hitting the second major surface of the glass substrate; wherein at least a central portion of the first major surface of the glass substrate is patterned so as to define a plurality of peaks and valleys in a patterned portion; and wherein an edge portion of the first major surface of the glass substrate, immediately adjacent an absolute edge of the glass substrate, is substantially flat and is located immediately adjacent the peaks and/or valleys of the patterned portion on the same first major surface, the substantially flat edge portion of the glass substrate being adapted to be at least partially covered by a frame such that the frame does not cover any significant part of the patterned portion of the first major surface of the glass substrate.

In still further example embodiments of this invention, there is provided a method of making a photovoltaic device, the method comprising: providing a glass substrate having first and second major surfaces, wherein the first major surface of the glass substrate is patterned so as to define a plurality of peaks and valleys in a patterned portion; grinding down an edge portion of the first major surface of the glass substrate, using at least one grinding wheel, so as to grind the patterned portion substantially flat at the edge portion but not in a central portion of the first major surface of the glass substrate, wherein following said grinding the edge portion is substantially flat; forming the photovoltaic device so that the glass substrate is located at a light-incident side of the photovoltaic device, and the second major surface of the glass substrate is closer to a semiconductor film of the photovoltaic device than is the first major surface which includes both the patterned portion and the substantially flat edge portion; and attaching a frame to the photovoltaic device so that the frame at least partially covers the substantially flat edge portion of the first major surface of the glass substrate but does not cover the patterned portion of the first major surface of the glass substrate.

DETAILED DESCRIPTION OF CERTAIN EXAMPLE EMBODIMENTS OF THIS INVENTION

Referring more particularly to the accompanying drawings in which like reference numerals indicate like parts throughout the several views.

Photovoltaic devices such as solar cells convert solar radiation and other light into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, tandem thin-film solar cells, and the like. Certain example embodiments of this invention may be applicable to CdS/CdTe type photovoltaic devices, for instance, as well as dye sensitized photovoltaic devices which need not be based on solid state semiconductor as an absorber but instead may be based on liquid and/or gel as an absorber material.

Figure 2:
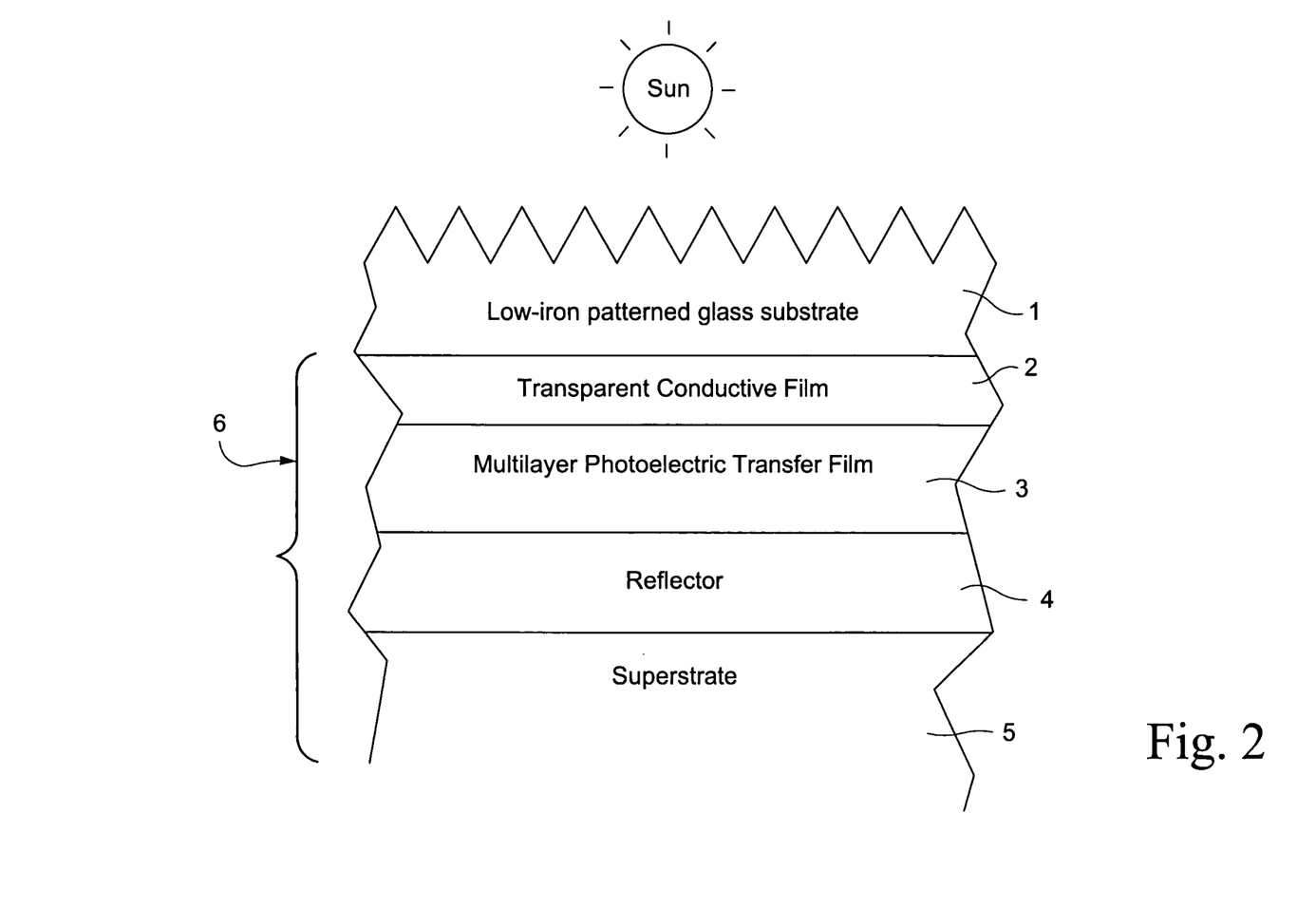
FIG. 2 is a more detailed cross sectional view of part of a photovoltaic device according to an example embodiment of this invention (note: the ground-flat portions of the glass substrate are not shown in FIG. 2 because FIG. 2 illustrates a central portion of the device and does not show edge portions thereof).

An example photovoltaic device is illustrated in cross section in FIG. 2. The photovoltaic device (e.g., solar cell) includes, for example and without limitation, high transmission light-incident side patterned glass substrate 1, conductive film 2 which may be of or include a transparent conductive oxide (TCO) in certain example instances, a photoelectric transfer film (or semiconductor, gel or liquid absorber) 3 which may include one or more layers, a rear or back electrode and/or reflector 4, and an optional glass superstrate 5. As shown in FIG. 2, the portion of the device below the top glass substrate 1 makes up the so-called photovoltaic cell 6. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. Other semiconductors may instead be used for the active photoelectric film and/or absorber 3 that converts incident radiation to electric current. Electrodes 2 and/or 4 may be of a transparent conductor such as conductive zinc oxide, conductive tin oxide, or any other suitable material in certain example embodiments of this invention.

Figure 1:
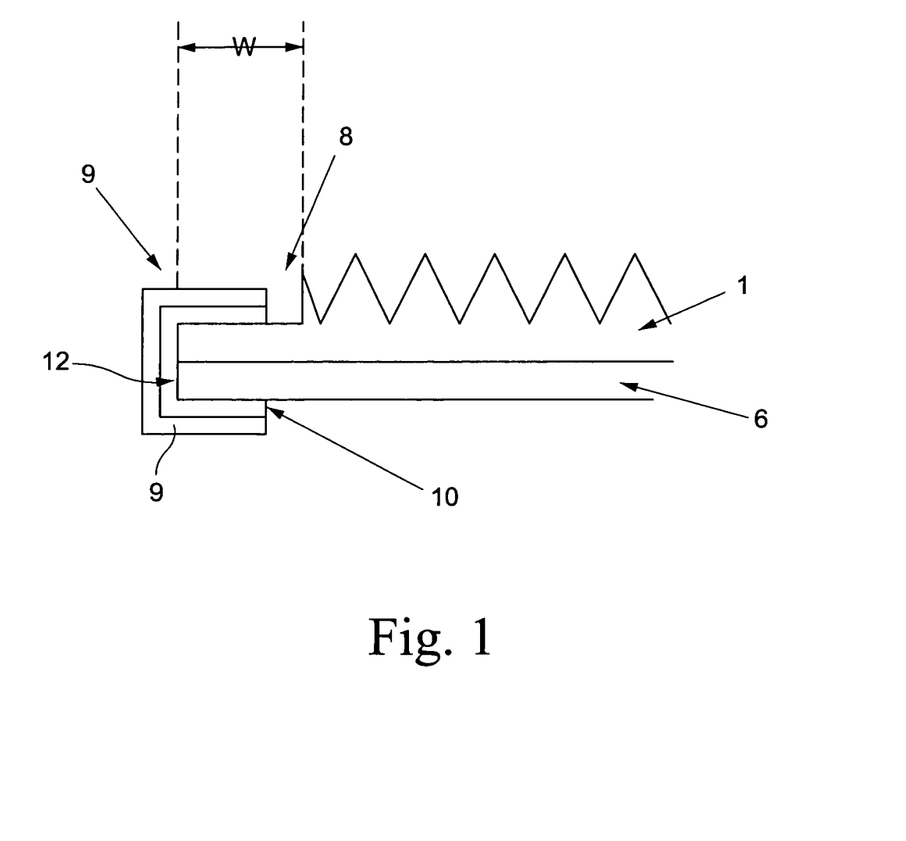
FIG. 1 is a cross sectional view of part of a photovoltaic device according to an example embodiment of this invention.

FIG. 1 illustrates an overall electronic device such as the photovoltaic devices of FIG. 2, according to an example embodiment of this invention. FIG. 1 differs from FIG. 2 in that FIG. 1 illustrates a peripheral portion of the device whereas FIG. 2 illustrates a central portion of the device. Thus, the ground down edge portion is shown in FIG. 1, but not in FIG. 2. Moreover, FIG. 1 illustrates the photovoltaic cell 6 in less detail than FIG. 2 (i.e., layers 2-5 are not shown in FIG. 1 for purposes of simplicity).

The use of a low-iron glass composition in combination with a patterned major surface of the light-incident glass substrate 1 has been found to be advantageous with respect to optical properties, thereby leading to increased solar efficiency of photovoltaic devices such as solar cells. It is generally desirable for the glass substrate 1 on the light-incident side of the semiconductor film (sometimes referred to as the semiconductor absorber) 3 to allow as much radiation as possible (UV, IR and visible) to pass therethrough so that the photoelectric semiconductor transfer film (or semiconductor absorber) 3 of the device can convert the radiation to as much current as possible. The less radiation allowed to pass through the glass substrate 1, the less current generated in the photovoltaic device.

As best shown in FIG. 1, in certain example embodiments of this invention, the major surface of the glass substrate 1 on the light-incident side of the electronic device (e.g., photovoltaic device) is ground down so as to be substantially flat at edge portion(s) 8 of the patterned side of the glass. In certain example embodiments, this grinding may be performed only at or proximate edge portions of the glass substrate 1 (i.e., not in central portions of the light-incident glass substrate).

The ground-down flat portions 8 proximate the edge portion(s) of the glass 1 are advantageous, for example, in that a frame (e.g., metal frame) 9 can more easily fit around the edge(s) of the electronic device so as to at least partially encapsulate the device. Such frames 9 are provided around the edges of photovoltaic devices, for instance, in order to protect the edges from mechanical damage and/or to seal the edges against ingress of water and the like.

The ground-flat portions 8 may be provided around the entire periphery of the glass substrate (e.g., at or proximate edge portions along all four sides of a rectangular substrate) in certain example instances, or alternatively along only one, two or three sides of the glass substrate 1 in alternative instances, according to different embodiments of this invention.

In the FIG. 1 embodiment, the frame 9 is substantially U-shaped when viewed cross-sectionally so that the edges of the glass substrate 1 and layers 2-5 fit into the channel defined by the U. The frame 9, which may optionally include seal and/or gasket material 10 located under the metal portion 9', may be provided around the entire periphery of the glass substrate (e.g., at or proximate edge portions along all four sides of a rectangular substrate) 1 and the device in certain example instances, or alternatively along only one, two or three sides of the glass substrate 1 and device in alternative instances, according to different embodiments of this invention. As best shown in FIG. 1, the absolute edge 12 of the photovoltaic device fits into the channel defined between the two legs of the substantially U-shaped frame 9.

In certain example embodiments of this invention, a particular type of low-iron glass may be used for the glass substrate 1 to realize high % IR (infrared transmission), high % UV (ultraviolet transmission), and/or high % TS (total solar transmission). In certain example embodiments, the glass substrate 1 may have fairly clear color that may be slightly yellowish (a positive b* value is indicative of yellowish color). For example, in certain example embodiments, the patterned glass substrate 1 may be characterized by a visible transmission of at least about 89% or 91%, a total solar/energy value of at least about 88% or 90%, more preferably at least about 91%, a transmissive a* color value of from −1.0 to +1.0 (more preferably from −0.5 to +0.5, and most preferably from −0.2 to 0), and a transmissive b* color value of from 0 to +1.5 (more preferably from +0.1 to +1.0, and most preferably from +0.2 to +0.6). These properties may be realized at an example non-limiting reference glass thickness of about 4 mm in certain example non-limiting embodiments.

Figure 3:
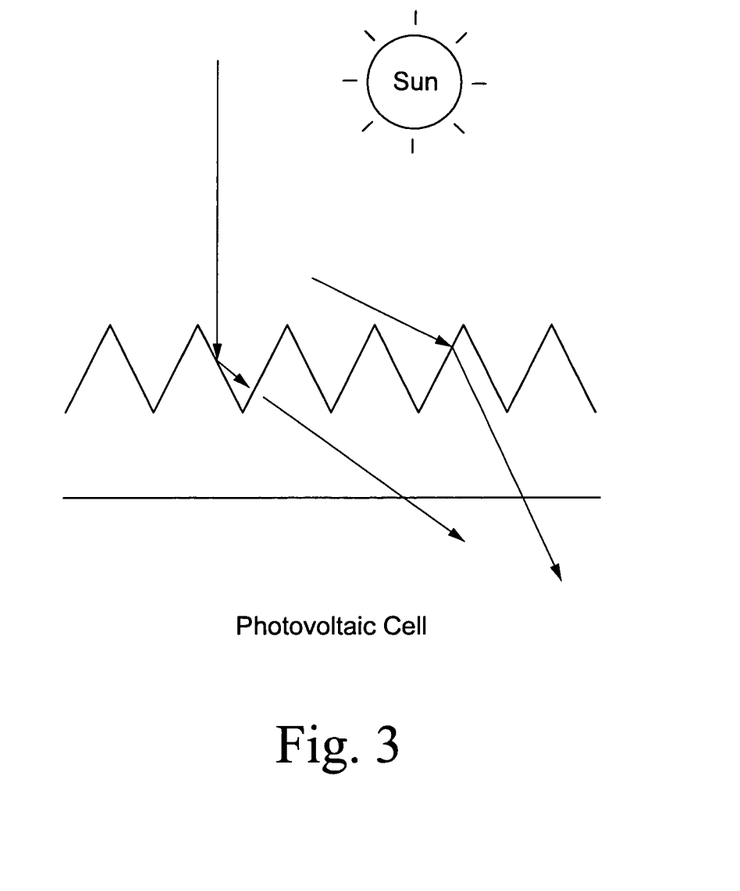
FIG. 3 is a schematic diagram illustrating how a patterned exterior surface of the light-incident glass substrate of a photovoltaic device can reduce reflections off of the front surface.

FIGS. 1 and 3 illustrate that in certain example embodiments the exterior or light-incident side major surface of the glass substrate 1 is patterned or textured. As best shown in FIG. 3, incoming light tends to be refracted at interface(s) resulting from the patterning of the glass substrate 1, thereby causing light to proceed through the glass toward the semiconductor film 3 (instead of being reflected away from the device by a flat surface). As a result, more light can be absorbed by the solar cell and output current and/or efficiency can be improved/increased. In certain example embodiments of this invention, the patterned surface(s) of the glass substrate 1 may have a surface roughness (between peaks/valleys) of from about 0.1 to 5 μm, more preferably from about 0.5 to 1.5 μm. In certain example embodiments of this invention, the glass substrate 1 has one or more surfaces which are patterned so as to have a waviness feature defined therein by ridges, pillars, cones, pyramids and/or the like. In the FIG. 1 and 3 embodiment, only one major surface of the glass substrate 1 is patterned, although in other example embodiments both major surfaces of the glass substrate may be patterned in a similar manner.

The patterning of the glass substrate 1 may take place either during the process of making the glass or alternative via etching or the like after the glass has been made/formed. An example technique for making such patterned glass is as follows. A furnace or melter is provided, as are first and second opposing rollers which define a nip therebetween. At least one of the rollers has a pattern defined in a surface thereof, where the pattern is made up of a plurality of peaks and valleys. A ribbon of glass exiting the furnace or melter is fed into the nip between the patterning rollers and reaches the nip at a temperature of from about 1,900 to 2,400 degrees F. At the nip, the pattern(s) from the roller(s) is transferred to the ribbon of glass, and then the patterned glass ribbon exits the nip at a temperature of from about 1,100 to 1,600 degrees F. After leaving the nip, the patterned glass ribbon is annealed, and may then be cut into a plurality of sheets. These glass sheets may or may not be heat treated (e.g., thermally tempered), and may be used in solar cell applications such as shown in FIGS. 1-2. Example techniques for making the patterned glass substrate 1 are illustrated and described in U.S. Pat. Nos. 6,796,146 and/or 6,372,327 (except that different types of patterns are used), the disclosures of which are hereby incorporated herein by reference. When the glass substrate is patterned, it may be made on a pattern line; whereas when it is not patterned it may be made on a float line. Alternatively, the glass 1 may be made via a float process with the pattern being etched into the major surface(s) of the glass after the glass has been made/formed by the float process.

Following the formation of the pattern in the glass substrate 1, the patterned surface of the glass substrate is ground down (e.g., by grinding) to be substantially flat at edge portions thereof as shown in FIG. 1. This grinding may be performed by any suitable technique, such as by one or more grinding wheels or the like. Thus, the advantageous substantially flat peripheral portion 8 may be formed on the patterned side of the glass substrate 1. However, in alternative example embodiments of this invention, the flat peripheral portion 8 need not be formed by grinding; instead, the flat portion 8 at the edge portion(s) of the glass 1 may be formed during the glass manufacturing process such as with the patterning roller having a flat portion at one or more edges thereof.

The flat or substantially flat portion 8 may have a width "W" extending inwardly from the absolute edge of the glass 1 of from about 0.1 to 2.5 cm, more preferably from about 0.5 to 2.0 cm, and most preferably from about 0.75 to 2.0 cm in certain example embodiments of this invention. This width W of the flat portion 8 is advantageous in that it does not significantly interfere with the optical properties of the glass substrate 1 yet still allows the frame 9 to be attached securely and efficiently using the flat portion 8 at the periphery of the substrate 1.

Certain glasses for patterned substrate 1 according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a slightly positive b* value) and/or have a high visible light transmission. These materials may either be present in the raw materials (e.g., small amounts of iron), or may be added to the base glass materials in the batch (e.g., cerium oxide).

Moreover, in addition to the ingredients in Table 1 above, other minor ingredients, including various conventional refining aids, such as $SO_3$ and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO. Moreover, from about 0.15 to 7% MgO, more preferably from about 1 to 7% MgO, is provided in the glass in certain example embodiments.

In certain example embodiments of this invention, the glass of substrate 1 is soda-lime-silica based (see base glass above) and is based on low iron raw materials such that the glass has a total iron ($Fe_2O_3$) content, in terms of wt. %, of no more than about 0.05%. In certain example embodiments, the glass has a total iron ($Fe_2O_3$) content of from about 0.010 to 0.045%, more preferably from about 0.010 to 0.035%, and most preferably from about 0.010 to 0.029%. This low iron content may result from the use of low-iron raw materials in making the glass, or alternatively may be added in certain example instances. Moreover, in certain example embodiments of this invention, the glass is extremely oxidized so as to have no or very little ferrous ($Fe^{2+}$; FeO). In certain example embodiments of this invention, the glass has a % FeO of no more than about 0.0038%, more preferably no more than about 0.0030%, even more preferably no more than about 0.0015%, more preferably no more than about 0.0010%. This low % FeO, in combination with other features, permits the glass to have a higher % UV transmission, and thus a higher % TS transmission, in combination with neutral color and high visible transmission, which are beneficial in solar cell applications. However, more iron than that listed above may be used in the glass 1 in alternative embodiments of this invention.

In certain example non-limiting embodiments, there is no or very little cerium oxide in the glass. Cerium oxide is a UV absorber, and thus prevents UV from being transmitted through the glass. Thus, cerium oxide is not desired in certain solar cell embodiments of this invention. Accordingly, in certain example embodiments of this invention, the glass has no more than about 0.01% cerium oxide, more preferably no more than about 0.001% cerium oxide, still more preferably no more than about 0.0005% cerium oxide, and most preferably 0% cerium oxide. However, in alternative embodiments of this invention, it is possible to use a small amount of cerium oxide. For example and without limitation, in certain example embodiments of this invention, the glass contains, from about 0 to 0.2% cerium oxide, more preferably from about 0 to 0.1% cerium oxide, and possibly from about 0.001 to 0.09% cerium oxide. As with all material percentages herein, these amounts are in terms of wt. %. The term cerium oxide as used herein includes $Ce_2O_3$, $CeO_2$, or the like. In certain example instances, glasses including cerium oxide herein may be used in applications such as greenhouse glazings where UV protection is desired.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm, more preferably no more than 1 ppm, and possibly as low as 0 ppm of the element or material. It is noted that small amounts of titanium oxide may be included in certain instances.

Glass 1 according to certain example embodiments of this invention achieves a neutral or substantially clear color, high visible transmission, high IR transmission, high UV transmission, and high total solar (TS) transmission. In certain embodiments, resulting glasses according to certain example embodiments of this invention may be characterized by one or more of the following transmissive optical, composition, or color characteristics (for the optics, an example non-limiting reference thickness of about 4 mm is used). Note that Lta is visible transmission %. It is noted that in the table below the L*, a* and b* color values are determined per Ill. D65, 10 degree Obs.

TABLE 2

CHARACTERISTICS OF EXAMPLE EMBODIMENTS

| Characteristic | General | More Preferred | Most Preferred |
|---|---|---|---|
| Lta (Lt D65): | >=85% | >=91% | >=91.5% |
| % TS (ISO 9050): | >=90% | >=91% | >=91.5% |
| % IR | >=80% | >=85% | >=90% (or >=91%) |
| % UV (300-400 nm): | >=80% | >=84% | >=85% (or 86%) |
| total iron ($Fe_2O_3$): | <=0.05% | 0.010-0.045% | 0.010-0.035% |
| % FeO (wt. %): | <=0.0038% | <=0.0030% | <=0.0015% (or 0.0010%) |
| Glass Redox: | <=0.12 | <=0.09 | <=0.08 or 0.06 |
| Batch Redox: | +12 to +30 | +15 to +30 | +20 to +30 |
| $SO_3$ | >=0.25 | 0.29-0.50 | >=0.30 (or >=0.31) |
| L* (Ill. D65, 10 deg.): | 90-99 | 94-99 | 95-98 |
| a* (Ill. D65, 10 deg.): | −1.0 to +1.0 | −0.5 to +0.5 | −0.25 to 0.0 |
| b* (Ill. D65, 10 deg.): | 0 to +1.5 | +0.1 to +0.8 | +0.2 to +0.6 |

The aforesaid characteristics of the glass substrate 1 are for the glass substrate alone, not the overall solar cell or solar cell module.

As can be seen from Table 2 above, glasses for substrate 1 of certain embodiments of this invention achieve desired features of fairly clear color and/or high visible transmission, with slightly positive b* color in certain embodiments, while not requiring iron to be eliminated from the glass composition. Moreover, high % UV and high % TS values are also achieved, which is advantageous for solar cell applications in that more radiation is permitted through the glass substrate 1 so that it can be converted to current or voltage. This may be achieved through the provision of the unique material combinations described herein, and/or process features discussed herein.

For purposes of example and without limitation, glasses described in any of commonly owned U.S. Ser. Nos. 11/049,292, 11/122,218 and/or 11/373,490 may be used for substrate 1 in different example embodiments of this invention. While these represent example glass that may be used for the substrate, it is of course possible to use other glass compositions for the substrate 1 in alternative embodiments of this invention.

Once given the above disclosure many other features, modifications and improvements will become apparent to the skilled artisan. Such features, modifications and improvements are therefore considered to be a part of this invention, the scope of which is to be determined by the following claims:

What is claimed is:

1. A photovoltaic device comprising:
   a glass substrate, a front electrode, and a semiconductor photoelectric film, where the front electrode is provided between at least the glass substrate and the photoelectric film;
   the glass substrate having first and second major surfaces, with at least part of the first major surface of the glass substrate being patterned and located at a light-incident side of the glass substrate so that light incident on the photovoltaic device hits the first major surface of the glass substrate before hitting the second major surface of the glass substrate;
   wherein at least a central portion of the first major surface of the glass substrate is patterned so as to define a plurality of peaks and valleys in a patterned portion having a surface roughness of from about 0.1 to 5 μm;
   a frame encapsulating at least part of an edge of the photovoltaic device so as to protect at least part of the edge of the photovoltaic device from damage; and
   wherein a substantially flat ground portion where peaks have been ground off is provided only proximate an edge of the glass substrate so that the ground portion where peaks have been ground off is not provided in a central area of the glass substrate, the substantially flat ground portion comprising a ground edge portion of the first major surface of the glass substrate, immediately adjacent the edge of the glass substrate, is substantially flat such that the peaks have been ground off in the ground edge portion, and is located immediately adjacent the peaks and/or valleys of the patterned portion on the same first major surface, and wherein part of the frame is located over at least part of the substantially flat ground edge portion but not over the patterned portion of the first major surface of the glass substrate, and wherein the substantially flat ground edge portion is located at an elevation below an elevation of a top portion of a plurality of the peaks of the patterned portion.

2. The photovoltaic device of claim 1, wherein the substantially flat ground edge portion of the glass substrate extends inwardly from the absolute edge of the glass substrate from about 0.1 to 2.5 cm.

3. The photovoltaic device of claim 1, wherein the substantially flat ground edge portion of the glass substrate extends inwardly from the absolute edge of the glass substrate from about 0.5 to 2.0 cm.

4. The photovoltaic device of claim 1, wherein the substantially flat ground edge portion of the glass substrate extends inwardly from the absolute edge of the glass substrate from about 0.75 to 2.0 cm.

5. The photovoltaic device of claim 1, wherein the substantially flat ground edge portion extends around an entire periphery of the first major surface of the glass substrate.

6. The photovoltaic device of claim 1, wherein the glass substrate is rectangular in shape as viewed from above, and the substantially flat ground edge portion extends along all four sides thereof.

7. The photovoltaic device of claim 1, wherein the frame is substantially U-shaped as viewed in cross section so as to define a channel between two legs of the U, and wherein the absolute edge of the photovoltaic device fits into the channel defined between the two legs of the substantially U-shaped frame.

8. The photovoltaic device of claim 1, wherein the glass substrate comprises a glass composition comprising:

| Ingredient | wt. % |
|---|---|
| $SiO_2$ | 67-75% |
| $Na_2O$ | 10-20% |
| CaO | >5-15% |
| total iron (expressed as $Fe_2O_3$) | 0.001 to 0.05% |
| % FeO | <=0.0038 |
| glass redox | <=0.12 |
| antimony oxide | 0 to less than 0.01% |
| cerium oxide | 0 to 0.2% | wherein the glass substrate has visible transmission of at least 91%, a transmissive a* color value of −1.0 to +1.0, a transmissive b* color value of from 0 to +1.5, % TS of at least 90%, and a UV transmission of at least 80%.

9. The photovoltaic device of claim 1, wherein the glass substrate comprises:

| % FeO | <=0.0030% |
|---|---|
| glass redox | <=0.09 |
| IR transmission (% IR) | >=90%. |

10. The photovoltaic device of claim 1, wherein the glass substrate has a % TS of at least 90.5%, a UV transmission of at least 84%, and comprises:

| % FeO | <=0.0015% |
|---|---|
| glass redox | <=0.08. |

11. The photovoltaic device of claim 1, wherein the glass substrate contains no more than 2 ppm of at least four of erbium oxide, nickel oxide, cobalt oxide, neodymium oxide, chromium oxide, and selenium.

12. The photovoltaic device of claim 1, wherein the glass substrate contains no more than 2 ppm of at least five of or all of erbium oxide, nickel oxide, cobalt oxide, neodymium oxide, chromium oxide, and selenium.

13. The photovoltaic device of claim 1, wherein the glass substrate comprises at least 0.25% $SO_3$ (wt. %).

14. The photovoltaic device of claim 1, wherein the glass substrate comprises at least 0.29% $SO_3$ (wt. %).

15. The photovoltaic device of claim 1, wherein the glass substrate comprises 0-0.01% cerium oxide (wt. %).

16. The photovoltaic device of claim 1, wherein the peaks are substantially sharp.

17. The photovoltaic device of claim 1, wherein the substantially flat ground edge portion extends along only one of four sides of the glass substrate.

18. The photovoltaic device of claim 1, wherein the substantially flat ground edge portion extends along only two of four sides of the glass substrate.

* * * * *